United States Patent
Ge (10) Patent No.: US 8,021,768 B2
(45) Date of Patent: Sep. 20, 2011

(54) PLAIN COPPER FOODWARE AND METAL ARTICLES WITH DURABLE AND TARNISH FREE MULTIPLAYER CERAMIC COATING AND METHOD OF MAKING

(75) Inventor: Molly Mo Hui Ge, Arlington Heights, IL (US)

(73) Assignee: National Material, L.P., Elk Grove Village, IL (US)

(*) Notice: Subject to any disclaimer, the term of this patent is extended or adjusted under 35 U.S.C. 154(b) by 102 days.

(21) Appl. No.: 12/419,552

(22) Filed: Apr. 7, 2009

(65) Prior Publication Data

US 2010/0255340 A1 Oct. 7, 2010

(51) Int. Cl.
*B32B 9/00* (2006.01)

(52) U.S. Cl. ........ 428/698; 428/212; 428/216; 428/336; 428/469; 428/472; 428/697; 428/699; 219/621

(58) Field of Classification Search ............ 428/698, 428/212, 216, 336, 469, 472, 697, 699; 219/621
See application file for complete search history.

(56) References Cited

U.S. PATENT DOCUMENTS

| | | | |
|---|---|---|---|
| 3,419,412 A * | 12/1968 | Morris et al. ............... 427/258 |
| 3,958,070 A | 5/1976 | Schintlmeister et al. |
| 3,983,275 A | 9/1976 | Winter et al. |
| 4,436,830 A | 3/1984 | Andreev et al. |
| 4,554,201 A | 11/1985 | Andreev et al. |
| 4,877,505 A | 10/1989 | Bergmann |
| 5,234,561 A | 8/1993 | Randhawa et al. |
| 5,262,241 A | 11/1993 | Huggins |
| 5,306,407 A | 4/1994 | Hauzer et al. |
| 5,403,882 A | 4/1995 | Huggins |
| 5,447,803 A | 9/1995 | Nagaoka et al. |
| 5,503,912 A | 4/1996 | Setoyama et al. |
| 5,525,420 A | 6/1996 | Kaufmann |
| 5,549,975 A | 8/1996 | Schulz et al. |
| 5,562,991 A | 10/1996 | Tannenbaum |
| 5,679,448 A | 10/1997 | Kawata |
| 5,700,551 A | 12/1997 | Kukino et al. |
| 5,707,748 A | 1/1998 | Bergmann |

(Continued)

FOREIGN PATENT DOCUMENTS

DE 567388 1/1933

(Continued)

OTHER PUBLICATIONS

International Search Report and Written Opinion, Jul. 20, 2010 for International Application No. PCT/US2010/028589, pp. 1-9.

(Continued)

*Primary Examiner* — Cathy Lam
(74) *Attorney, Agent, or Firm* — Dinsmore & Shohl LLP (57) ABSTRACT

Soft and porous material is coated with a multilayer ceramic coating by physical vapor deposition. The coated material is suitable for use as foodware, particularly, a copper foodware article including a plain copper substrate, a base coating, and a ceramic coating. The base coating is deposited by sputtering and cathodic arc in combination, providing the good corrosion resistance and adhesion to the substrate. The ceramic coating includes a PVD nitride or carbonitride layer, providing a tarnish-free surface, good durability, and thermal stability. The coated copper foodware article has the same heat conductivity as pure copper, good corrosion resistance, high durability, excellent cooking, and ease of cleaning. A metal article having a multilayer coating and a method of making a metal article are also described.

26 Claims, 6 Drawing Sheets

U.S. PATENT DOCUMENTS

| | | | |
|---|---|---|---|
| 5,810,947 | A | 9/1998 | Wu et al. |
| 5,879,532 | A | 3/1999 | Foster et al. |
| 5,879,823 | A | 3/1999 | Prizzi et al. |
| 5,880,205 | A | 3/1999 | Tannenbaum |
| 5,882,777 | A | 3/1999 | Kukino et al. |
| 6,033,734 | A | 3/2000 | Muenz et al. |
| 6,033,768 | A | 3/2000 | Muenz et al. |
| 6,080,496 | A | 6/2000 | Hupf et al. |
| 6,090,223 | A | 7/2000 | Kiuchi et al. |
| 6,103,074 | A | 8/2000 | Khominich |
| 6,114,028 | A | 9/2000 | Muchin et al. |
| 6,197,438 | B1 | 3/2001 | Faulkner |
| 6,360,423 | B1 | 3/2002 | Groll |
| 6,399,219 | B1 | 6/2002 | Welty et al. |
| 6,427,904 | B1 | 8/2002 | Groll |
| 6,497,772 | B1 | 12/2002 | Meckel et al. |
| 6,544,669 | B2 | 4/2003 | Groll |
| 6,565,957 | B2 | 5/2003 | Nakamura et al. |
| 6,617,057 | B2 | 9/2003 | Gorokhovsky et al. |
| 6,824,601 | B2 | 11/2004 | Yamamoto et al. |
| 6,906,295 | B2 * | 6/2005 | Ge .............................. 219/621 |
| 6,942,935 | B2 * | 9/2005 | Ge .............................. 428/698 |
| 7,081,186 | B2 | 7/2006 | Ehiasarian et al. |
| 7,462,375 | B2 * | 12/2008 | Ge ........................ 427/255.15 |

FOREIGN PATENT DOCUMENTS

| | | |
|---|---|---|
| EP | 0872575 | 10/1998 |
| EP | 1132498 A1 | 9/2001 |
| EP | 1219723 A2 | 7/2002 |
| GB | 2400113 A | 6/2004 |
| JP | 7237010 A | 9/1995 |
| JP | 8120445 A | 5/1996 |
| JP | 9256138 A | 9/1997 |
| JP | 932304 | 12/1997 |
| JP | 9323205 A | 12/1997 |
| JP | 10251831 A | 9/1998 |
| JP | 11131215 A | 5/1999 |
| JP | 11131216 A | 5/1999 |
| JP | 11156992 A | 6/1999 |
| JP | 2000297365 A | 10/2000 |
| JP | 2001254187 A | 9/2001 |

OTHER PUBLICATIONS

Hovsepian, et al., "Combined Cathodic Arc Unbalanced Magnetron Grown CrN NbN Superlattice Coatings for Applications in the Cutlery Industry", Surface and Coatings Technology, 2000, pp. 509, 510, 512, 514, 516.

Wang, et al., "Joining Ceramics to Metals by Abnormal Glow Discharge Plasma", Journal of the Ceramic Society of Japan, 2005, pp. 409-412.

Harris, S.G. et al., "Influence of chromium content on the dry machining performance of cathodic arc evaporated TiA1N coatings", Wear 254 (2003), pp. 185-194.

Jehn et al., "Morphology and properties of sputtered (Ti,Ai)N layers on high speed steel substrates as a function of deposition temperature and sputtering atmosphere", J. Vac. Sci. Technol. A 4 (6), Nov./Dec. 1986, pp. 2701-2705.

Knotek et al., "On structure and properties of sputtered Ti and Al based hard compound films", J. Vac. Sci. Technol. A 4 (6), Nov./Dec. 1986, pp. 2695-2700.

Munz, "Titanium aluminum nitride films: A new alternative to TiN coatings", J. Vac. Sci. Technol. A 4 (6), Nov./Dec. 1986, pp. 2717-2725.

McIntyre et al., "Oxidation of metastable single-phase polycrystalline $Ti_{0.5}, Al_{0.5}N$ : Kinetics and mechanisms" J. Appl. Phys. 67 (3), Feb. 1, 1990, pp. 1542-153.

Knotek et al., "On Wear and Corrosion Resistant PVD CrN Coatings", 8. Int. Congr. on Heat Treatm. of Mater. Kyoto, Japan 1992, o.S., pp. 543-546.

Ichimura et al., "High temperature oxidation of ion-lated CrN films", J. Mater Res., vol. 9, No. 1, Jan. 1994, pp. 151-155.

Donahue et al., "Microstructure and oxidation-resistance of $Ti_{l-x-y-z}Al_xCr_yY_2N$ layers grown by combined steered-arc/unbalanced-magnetron-sputter deposition", Surface and Coatings Technology 94-95, 1997, pp. 226-231.

Aouadi et al., "In-Situ Ellipsometry Study on Nitride Coatings", Invited Paper, Vacuum Technology & Coating, Sep. 2002, pp. 33-38.

Anders, "Part 1: Cathodic Arc Plasma Deposition", Vacuum Technology & Coating, Jul. 2002, pp. 27-35.

Luo et al., "Tribological investigation of TiAlCrN and TiAlN/CrN coatings grown by combined steered-arc/unbalanced magnetron deposition" Vacuum, 5(1-2), 123-126 CODEN, 1999.

Hovespian et al., Advanced Application Tailored PVD Coatings Utilizing Nanoscale Multilayer Superlattice Structures, pp. 29-35, Nov. 2002.

Pellman, Multi-Arc, Inc., PVD Coatings for Medical Device Applications, http:/www.pfonline.com/articles/070003. html, Jul. 2000.

Aharonov et al., How Chromium Nitride performs on metal forming dies, The Fabricator, Jun. 1995, pp. 26-29.

Wadsworth et al., Thermal stability and oxidation resistance of TiAN/CrN multilayer coatings, Surface and Coatings Technology 94-95 (1997) 315-321.

Chiba et al., Wear resistance of arc ion-plated chromium nitride coatings, J. Mater. Res., vol. 8, No. 5, May 1993, pp. 1109-1115.

Rossnagel, "Sputtering and Sputter Deposition," Thin-Film Deposition Processes and Technologies, pp. 319-348nm, (2001).

Ghosh et al., Study of the relative wear and abrasion resistance Ti(C,N) and TiN coatings, Surface and Coatings Technology, 54/55, (1992), pp. 466-469.

Randhawa et al., New development in decorative vacuum coatings, Metal Finishing, Sep. 1988, copyright 1988 by Metals and Plastics Publications, Inc., pp. 15-18.

Bull et al., Properties and performance of commercial TiCN coatings. Part 1: coating architecture and hardness modelling, Surface and Coatings Technology, 163-164, (2003), pp. 499-506.

Bull et al, Properties and performance of commercial TiCN coatings, part 2: tribological performance, Surface and Coatings Technology, 163-164, (2003), pp. 507-514.

* cited by examiner

Figure 1

Prior Art

Figure 2

Prior Art

PLAIN COPPER FOODWARE AND METAL ARTICLES WITH DURABLE AND TARNISH FREE MULTIPLAYER CERAMIC COATING AND METHOD OF MAKING

BACKGROUND

The invention relates generally to metal articles, and more particularly to a metal article having a multilayer coating, and to methods of making such metal articles. In one embodiment, the invention relates generally to a plain copper foodware article having stick resistance properties and good heat conductivity like pure copper, and more particularly to a plain copper foodware article having a multilayer, durable, stick resistant, ceramic coating, and to a method of making such foodware articles.

Cookware can be made using a variety of base materials, including cast iron, aluminum, stainless steel and clad stainless steel, and clad copper.

Seasoned cast iron cookware has a tough, abrasion resistant surface. However, cast iron is subject to rusting, and it must be cleaned carefully to avoid damage to the cookware surface. In addition, acid in foods can cause leaching of the iron from the surface, which can lead to health problems in some cases.

Copper cookware has excellent heat transfer properties. However, it is easily scratched because it is much softer than other cookware materials, such as cast iron or stainless steel. Copper also oxidizes readily, which leads to tarnishing. Copper can be polished to remove the tarnish, but it requires substantial effort to maintain the surface finish. Furthermore, copper ions can leach into foods.

Aluminum cookware has excellent heat transfer properties. However, aluminum is also subject to leaching of ions. One way to reduce this problem is to coat the surface of the aluminum. Anodized aluminum is coated with aluminum oxide. The oxide layer makes it much harder than untreated aluminum. (Untreated aluminum has a thin layer of aluminum oxide from reaction with oxygen in the air.) However, food will generally stick to anodized aluminum cookware unless oil is used in cooking. In addition, anodized aluminum cookware is not dishwasher-safe, as it can be discolored or corroded by typical automatic dishwashing products.

Aluminum can also be treated by thermal spraying to prevent leaching. However, this process produces a rough surface, and food will generally stick to the surface unless it is treated.

Stainless steel cookware is widely used. It is known for its strength and durability. Stainless steel is relatively easy to clean, and it holds its shine better than copper. However, food is more likely stick to stainless steel than to seasoned cast iron. Overheating, cooking with salt water, or letting the pan "cook dry" causes discoloration of the surface. In addition, although it is typically quite low, leaching of ions, such as iron, chromium, manganese, and nickel, can also be a concern with stainless steel.

In addition, stainless steel is a poor heat conductor. The thermal conductivity of stainless steel at 225° C. is only 19 W/mK, while, at the same temperature, copper is 398 W/mK and aluminum is 250 W/mK. Thus, copper has the heat transfer about 20 times higher than stainless steel.

The performance of stainless steel cookware is largely determined by how well the pan spreads heat, thereby reducing or eliminating "hot spots". To disperse the heat of stainless steel cookware, an aluminum or copper disc can be added to the bottom of the pan using brazing or impact bonding (the side wall is stainless steel). Although the heat conductivity is improved, the heat distribution of the entire pan is uneven. Further, if the user cooks the food with prolonged overheating, or the pan boils dry, the disc can be separated from the pan.

Figure 1:
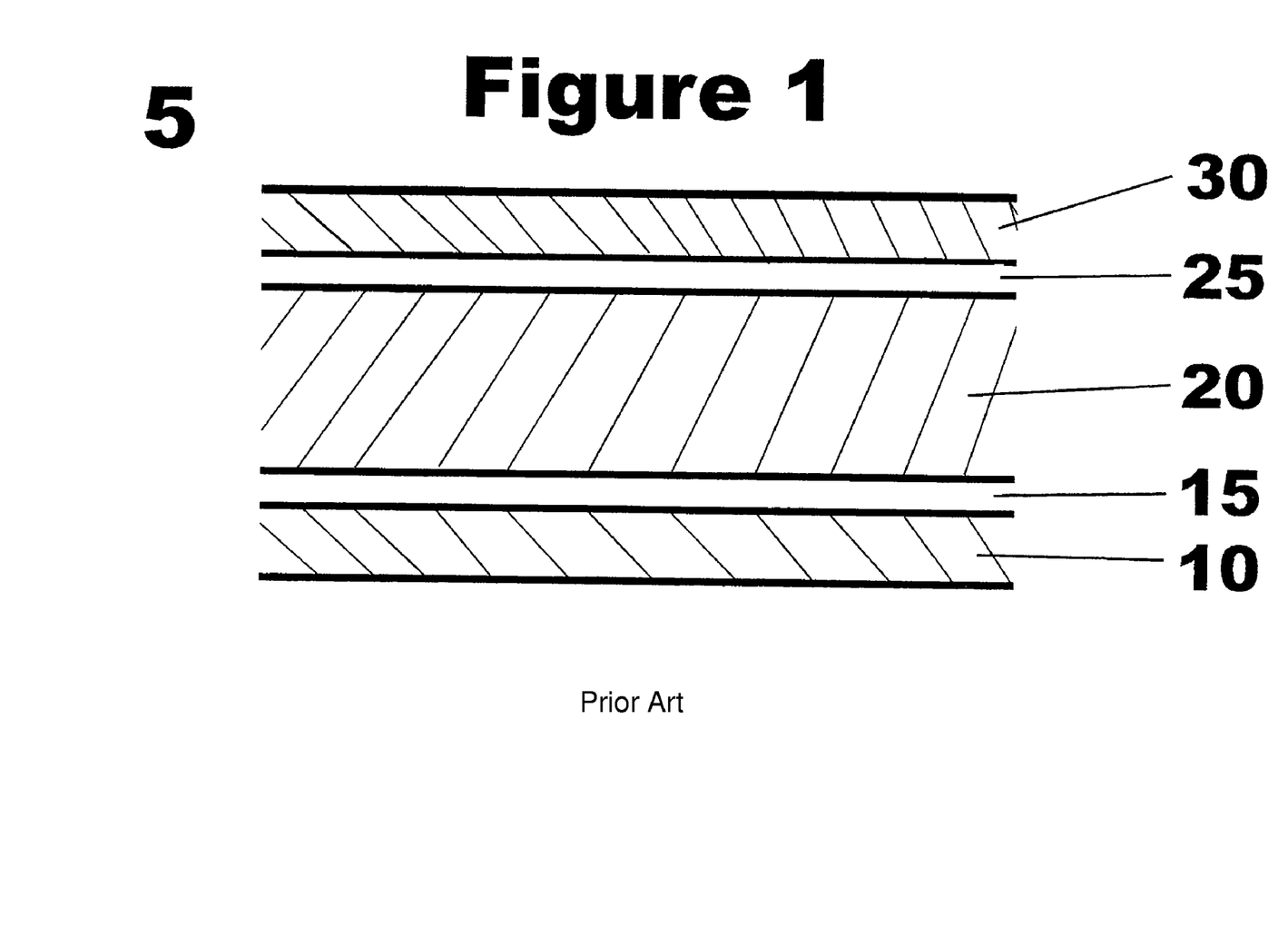
FIG. 1 is a cross-section of a pan made of 5-ply clad stainless steel.

Another approach to disperse the heat of stainless steel cookware is to use clad stainless steel as the base material of the cookware. Clad material is made of stainless steel and aluminum or copper sandwiched together. These pans conduct heat evenly up the side walls instead of just on the bottom. The clad stainless steel cookware heats quickly, but also cools rapidly because the copper or aluminum core is a good conductor of heat and cold. For example, as shown in FIG. 1, a clad stainless steel pan 5 made of a 5-ply material with a total thickness of 1.87 mm can have an interior 304 stainless steel layer (0.336 mm) 10, an aluminum layer (0.140 mm) 15, a copper core (0.940 mm) 20, an aluminum layer (0.140 mm) 25, and an exterior 430 stainless steel layer (0.31 mm) 30. One example of a 3-ply material with a total thickness of 2.71 mm includes an interior 304 stainless steel layer (0.394 mm), an aluminum core (1.930 mm), and an exterior 430 stainless steel layer (0.386 mm). The heat conductivity of clad stainless steel is a combination of the poor conductivity of the stainless steel layers, which are about 28-35% of total thickness, and the good conductivity of aluminum, or copper.

3-ply and 5-ply stainless steel cookware have the same disadvantages as normal stainless steel cookware: discoloration and scratching of the cooking surface. The cookware can be easily scorched when cooking at high temperature, and cleaning the scorched interior surface takes a lot of time. In addition, the interior stainless steel surface layer can be removed during scrubbing. In many demanding restaurants, a 5-ply skillet will last only about 7-8 months because the copper-core becomes exposed.

Figure 2:
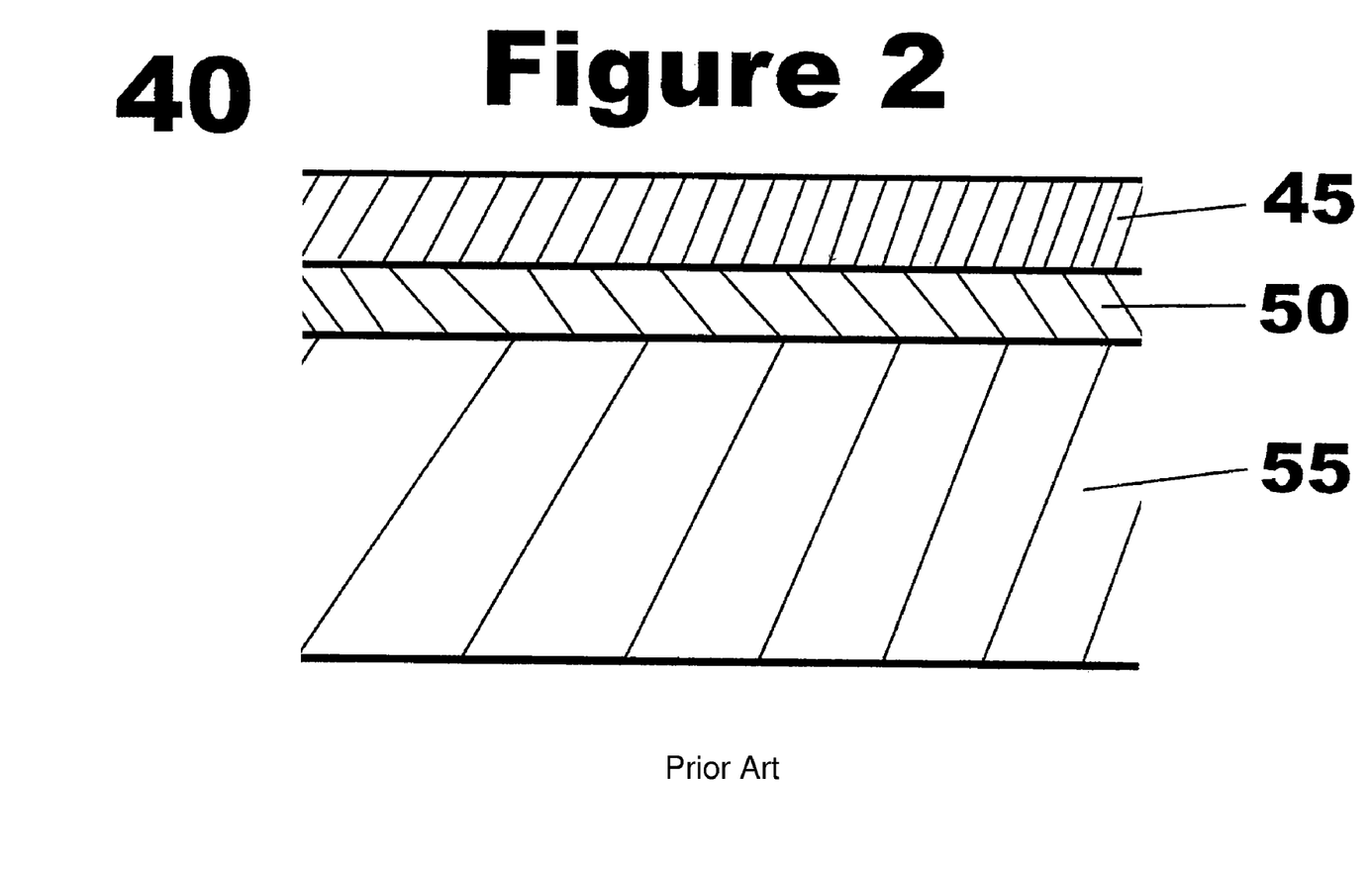
FIG. 2 is a cross-section of a pan made of clad copper.

Another approach to disperse more heat is to use clad copper as the base material of cookware. As shown in FIG. 2 for example, a pan 40 made of a clad copper material with a total thickness of 2.2 mm can have an interior 304 stainless steel layer (0.4 mm) 45, an aluminum layer (0.3 mm) 50, and an exterior layer of copper (1.5 mm) 55. In this case, the stainless steel layer is reduced to 18% of the total. The resultant heat conductivity of clad copper cookware is better than that of either 3-ply or 5-ply clad stainless steel cookware. However, the interior stainless steel surface has the same problems as other stainless steel cookware: discoloration/scorching and scratching. In addition, the exterior copper surface can readily oxidize. Maintaining the copper surface finish requires substantial effort, as discussed above.

Surface treatments to prevent sticking are known. One well-known surface treatment for cookware involves the use of perfluorocarbon polymers. Perfluorocarbon coatings provide a non-stick surface, but they are easily scratched. Even though current perfluorocarbon coatings are tougher than their predecessors, they are still fairly easy to scratch. When the surface is scratched or nicked, flakes of the perfluorocarbon coating can get into the food being cooked. This flaking is objectionable to many people, despite the fact that perfluorocarbon flakes are not known to pose a health risk. In addition, although the perfluorocarbon polymers are safe at normal cooking temperatures, they can be damaged at high temperatures and may give off toxic fumes.

Another surface treatment involves the use of ceramic coatings. U.S. Pat. No. 5,447,803 describes the deposition of a layer of titanium and a layer of titanium nitride. The titanium nitride coating has high hardness, and a gold color. The titanium nitride coating can be oxidized or nitrided to stabilize the color, but these oxide or nitride coatings are thin and can still be scratched, resulting in possible discoloration of the pan.

U.S. Pat. No. 6,197,438 describes the use of a thick layer (about 2 to 50 microns) of chromium nitride or aluminum nitride as a primer or topcoat layer to achieve scratch resistance and non-stick properties. A decorative or functional top coat layer such as silicon nitride, alumina, or diamond-like carbon can be added. Ceramic coated foodware based on a plasma-sprayed aluminum alloy substrate is also disclosed.

U.S. Pat. No. 6,360,423 describes the deposition of a zirconium nitride coating on cookware. The surface must be polished to a high surface smoothness before the zirconium nitride layer is deposited in order to obtain a stick resistant coating. Although the zirconium nitride coating does not need to be oxidized or nitrided to stabilize the color, zirconium nitride can be discolored in varying degrees by overheating or by salty-based foods.

U.S. Pat. Nos. 6,906,295, and 7,462,375 describe foodware articles having a multilayer, ceramic coating which is stick resistant, scratch resistant, thermally stable, corrosion resistant, and color stable. The foodware article includes a metal foodware article having an inner food-contacting surface and an outer surface. There is a bonding layer deposited on the food-contacting surface, which is typically a metal layer. A layer of (Ti,Al,Cr)N is deposited adjacent to the bonding layer. The coating can optionally include alternating layers of CrN, and (Ti,Al,Cr)N.

There is a need for cookware which has better heat conductivity than clad stainless steel cookware or clad copper cookware, but which does not have the discoloration/scorching and scratching problems associated with the interior stainless surface of clad stainless and clad copper cookware. In addition, there is a need for cookware which has the same heat conductivity as pure copper, and a need for a scratch resistant, stick resistant, thermally stable ceramic coating which has the appearance of metal, which is suitable for use at high cooking temperature, and which can be used with both acidic and salty-based foods.

There is also a need for a ceramic coating with good adhesion to a soft and porous base material, and with good corrosion resistance.

SUMMARY OF THE INVENTION

The present invention meets that need by providing a copper foodware article having a multilayer, stick resistant, tarnish-free coating. The copper foodware article includes a copper substrate; a base coating deposited on a first surface of the copper substrate comprising: a combination cathodic arc and sputtered bonding layer comprising a material selected from metals, alloys of metals, or combinations thereof; and a ceramic coating deposited adjacent to the base coating, the ceramic coating comprising a PVD nitride or carbonitride layer.

Another aspect of the invention is a metal article with a multilayer, stick resistant, tarnish-free ceramic coating. The metal article includes a metal substrate; a base coating deposited on a first surface of the metal substrate comprising: a combination cathodic arc and sputtered bonding layer comprising a material selected from metals, alloys of metals, or combinations thereof; and a ceramic coating deposited adjacent to the base coating, the ceramic coating comprising a PVD nitride or carbonitride layer.

Another aspect of the invention is a method of making a metal article having a multilayer, stick resistant, tarnish-free coating. The method includes providing a metal substrate; depositing a base coating on a first surface of the metal substrate comprising: depositing a combination cathodic arc and sputtered bonding layer using a combination of a cathodic arc process and a sputtering process, wherein the combination cathodic arc and sputtered bonding layer is made of a material selected from metals, alloys, or combinations thereof; and depositing a ceramic coating adjacent to the base coating comprising depositing a PVD nitride or carbonitride layer using a PVD process.

By nitride or carbonitride layers, I mean nitride or carbonitride alloys. The nitrides and carbonitrides will generally be one or elements from Groups 4, 5, and 6 of the periodic table, Al, or B. Typically, the nitrides or carbonitrides will contain at least one of Ti, Al, Cr, Zr, Nb, V, Mo, or B. Nitrides and carbonitrides include, but are not limited to TiN, CrN, NbN, ZrN, BN, AlCrN, TiAlN, (Ti,Al,Cr)N, (Al,Cr,X)N, and TiCN, CrCN, ZrCN, BCN, AlCrCN, TiAlCN, (Ti,Al,Cr)CN, (Al,Cr,X)CN.

By (Al, Cr,X)N or (Al,Cr,X)CN, I mean nitride or carbonitride alloys of aluminum, and chromium with an additional element. X will generally be one or elements from Groups 4, 5, and 6 of the periodic table, or B. X is typically one of Ti, Zr, Nb, V, Mo, or B. Nitride and carbonitride alloys of aluminum, chromium, and an additional element include, but are not limited to a superlattice structured coating of aluminum X nitride, and chromium nitride or other combinations.

By (Ti,Al,Cr)N, or (Ti,Al,Cr)CN I mean nitride or carbonitride alloys of titanium, aluminum, and chromium. Nitride alloys of titanium, aluminum, and chromium include, but are not limited to a superlattice structured coating of titanium aluminum nitride, and chromium nitride. Carbonitride alloys of titanium, aluminum, and chromium include, but are not limited to a superlattice structured coating of titanium aluminum carbonitride, and chromium carbonitride.

By biocompatible, I mean the coating must meet the biocompatibility test conducted according to ISO10993-1. Examples of biocompatible coatings include, but are not limited to TiN, CrN, TiN/TiCN, AlTiN, TiAlN, ZrN, (Ti,Al,Cr)N.

By plain copper, I mean copper without any cladding layers

By "deposited on," I mean deposited directly on the previous layer without any intervening layers. By "deposited adjacent to," I mean deposited next to, but not necessarily directly on, the previous layer. It could be deposited directly on the previous layer, or there could be one or more intervening layers between layers deposited adjacent to one another.

DETAILED DESCRIPTION OF THE INVENTION

The present invention is particularly designed for coating soft and porous substrates like copper and aluminum by depositing multi layer ceramic coatings. The multilayer ceramic coating includes a base coating and a ceramic coating. The base coating and the ceramic coating have different functions. The base coating provides good strength of adhesion to the substrate material and good corrosion resistance. The ceramic coating provides the functionality desired, such as good durability, stick resistance or non-stick performance, tarnish-free, and thermally stable properties.

Non-ferrous materials like copper and aluminum are soft and porous. Corrosion is major concern with these materials. Therefore, a thick, dense, and smooth base coating deposited on the substrate is needed. Sputtering processes are better than cathodic arc processes in terms of providing good corrosion resistance. Sputtering processes, including, but not limited to, DC sputtering, reactive sputtering, or magnetron sputtering, can be precisely controlled by the defined coating parameters, such as bias voltage and suitable device, to produce a smooth, dense film. The cathodic arc generates macroparticles, so-called droplets, which can interrupt a dense film, resulting in inferior corrosion resistance. However, the cathodic arc process bombards the substrate with high energy metal ions that can penetrate into substrate, resulting in good strength of adhesion to the substrate.

Although the discussion which follows focuses on the use of the multilayer ceramic coating for foodware, the coating can be used on other articles as well. Examples include, but are not limited to decorative articles, plumbing fixtures, hardware, and the like.

By "foodware," I mean cookware, food preparation pieces including cutlery and other manual food processing pieces (such as colanders, strainers, and the like), food serving pieces (such as plates, bowls, and the like), and utensils for eating food. By "cookware," I mean pots and pans for stovetop cooking, bakeware, griddles, grills, cooking utensils (such as spoons, spatulas, and the like), and food preparation devices that are used to cook food (such as electric frying pans, rice cookers, and the like). By "stick resistant," I mean that the foodware article at least has stick resistant properties; it may have non-stick properties as well.

Figure 3:
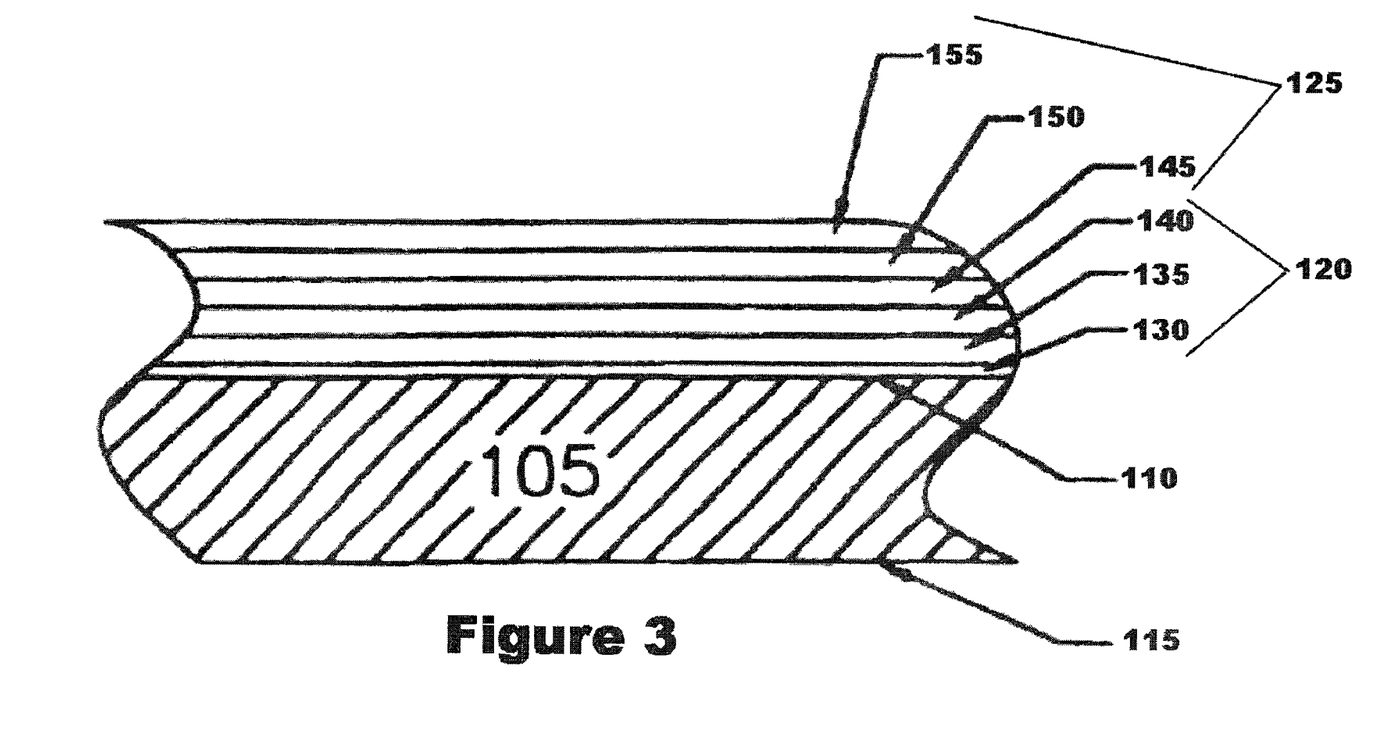
FIG. 3 is a cross-section of one embodiment of the article of the present invention.

FIG. 3 shows a cross-section of one embodiment 100 of the article of the present invention. There is a metal article 100. The metal substrate 105 has a first surface 110 and a second surface 115. The metal substrate can be various materials, including, but not limited to steel, stainless steel, plain copper, aluminum, cast iron, clad materials, magnalium alloy, and alloys and combinations thereof. The metal substrate can be a solid metal or a solid alloy, or it can be a clad material, such as a multilayer structure having a metal surface. Examples of multilayer, structures, include, but are not limited to, stainless steel-clad aluminum or copper, aluminum having a plasma sprayed stainless steel coating, or metal outer layers surrounding non-metallic core materials, such as graphite.

There is a base coating 120 deposited on the first surface 110 of the substrate 105, and a ceramic coating 125 deposited adjacent to the base coating 120. The total thickness of the base coating is typically between about 2 and about 20 microns, while the total thickness of the ceramic coating is generally between about 1 to about 20 microns.

The base coating 120 includes a combination cathodic arc and sputtered bonding layer 130. This combination layer is deposited using a combination of a cathodic arc process and a sputtering process operated at the same time. The combination layer increases the strength of adhesion of the base coating while reducing the possibility of disturbing corrosion resistance. The combination cathodic arc and sputtered layer can comprise metals, alloys of metals, or combinations thereof. In the sputtering process used to make the layer, metals and metal alloys can be used. Suitable metals and metal alloys include, but are not limited to, titanium, chromium, zirconium, niobium, and hafnium, as well as various types of stainless steel, such as 304 or 316, TiAl, and AlCr. In the cathodic arc process used to make the layer, metals and metal alloys can be used. Suitable metals and metal alloys include, but are not limited to, titanium, chromium, zirconium, niobium, and hafnium. Desirably, pure metals are used for the cathodic arc process because they allow better penetration into the substrate.

In order to control the droplets from the cathodic arc process, the total deposit from the cathodic arc targets (one or more) is in the range of about 5 to about 40% of the total deposit from the combination of the cathodic arc targets and the sputtering targets (one or more).

The base coating 120 can be a single layer, if desired. Alternatively, it include one or more additional layers, as shown in FIG. 3 for example. The additional layers can include one or more additional combination layers, and/or one or more sputtered layers, and/or one or more cathodic arc layers.

As shown in FIG. 3, the base coating 120 includes a sputtered layer 135, which is deposited by a sputtering process adjacent to the combination cathodic arc and sputtered bonding layer. In the sputtering process for the sputtered layer, metals and metal alloys can be used. Suitable metals and metal alloys include, but are not limited to, titanium, chromium, zirconium, niobium, and hafnium, as well as various types of stainless steel, such as 304 or 316, TiAl, and AlCr.

There is also a second combination cathodic arc and sputtered bonding layer 140 deposited adjacent to the first sputtered layer. The second combination layer is made using the same general processes and materials as the first combination layer. However, the processes and material for the two layers do not have to be the identical (e.g., the first combination layer could use different metals than the second, and/or use different types of sputtering processes or cathodic arc processes).

Suitable sputtering processes for either the sputtering process in the combination layer or the sputtered layer include, but are not limited to, reactive sputtering, DC sputtering, and magnetron sputtering. Additional alternating layers of sputtered layers and combination layers can be deposited, if desired. The top layer of the base coating can be a combination cathodic arc and sputtered bonding layer, if desired.

For optimum corrosion resistance, the sputtered layer is thicker than the combination layer in the base coating. Alternating layers of sputtered layers and combination layers can also increase the hardness and toughness of the base coating that serves as a foundation for the multilayer ceramic coating.

There is a ceramic coating 125 adjacent to the base coating. The ceramic coating 125 can be one or more layers. At least one of the layers is a PVD nitride or carbonitride.

The PVD nitride or carbonitride layer 145 is deposited adjacent to the base coating 120. The PVD nitride or carbonitride layer provides a tarnish-fee surface that has excellent durability and thermal stability. Suitable materials for the nitride or carbonitride alloy include, but are not limited to, TiN, CrN, NbN, ZrN, BN, AlCrN, TiAlN, (Ti,Al,Cr)N, (Al, Cr, X)N, and TiCN, CRCN, ZrCN, BCN, AlCrCN, TiAlCN, (Al,Cr, X)CN. X includes, but is not limited to, one of Ti, Zr, Nb, V, Mo, or B.

The PVD nitride or carbonitride layer is desirably made of a biocompatible material. This allows the article to be used for foodware and the like.

There can be additional nitride or carbonitride layers, if desired, as described below.

The composition of the various PVD nitride or carbonitride layers can be the same, or it can be different for different layers, if desired. For example, if (Ti,Al,Cr)N is used, the amounts of Ti, Al, and Cr can vary among the layers. Alternatively, different elements can be used, such as (Ti,Al,Cr)N and (Zr,Al,Cr)N. The composition can be varied by altering the number and type of targets being used for each layer, as is well-known in the art.

One example of a suitable PVD nitride layer is (Ti,Al,Cr) N. A smooth (Ti,Al,Cr)N layer possesses the characteristics of a non-reactive surface, resulting in at least stick resistant performance, and often non-stick performance. If desired, the superlattice concept, (Ti,Al)N/CrN, system, can be utilized to produce a (Ti,Al,Cr)N coating suitable for application to a substrate, such as a foodware article.

A coating of alternating (Ti,Al,Cr)N/CrN layers is desirable because it further improves the toughness of the multilayer coating. This allows drawing a metal sheet with a thin multilayer coating without cracking the coating in the forming process.

A first layer of (Ti,Al,Cr)N 145 is deposited adjacent to the base coating 120. The first (Ti,Al,Cr)N layer 145 provides a strong, scratch resistant, stick resistant, thermally stable base layer. Although the first (Ti,Al,Cr)N layer is shown as being deposited on the base coating in this embodiment, there could be one or more intervening layers between the base coating 120 and the first (Ti,Al,Cr)N layer 145, if desired. The first (Ti,Al,Cr)N layer 145 is typically in the range of from about 0.1 to about 1.5 microns thick.

There can optionally be a first layer of chromium nitride 150 deposited adjacent to the first (Ti,Al,Cr)N layer 145. Although the first chromium nitride layer 150 is shown as being deposited on the first (Ti,Al,Cr)N layer 145 in this embodiment, there could be one or more intervening layers between the first (Ti,Al,Cr)N layer 145 and the first chromium nitride layer 150, if desired. The first chromium nitride layer 150 is generally less than about 2 microns thick. In the event the upper layers are penetrated, the first chromium nitride layer provides corrosion resistance and oxidation resistance.

A second layer of (Ti,Al,Cr)N 155 can optionally be deposited on the first chromium nitride layer 150. The second (Ti,Al,Cr)N layer is generally less than about 10 microns thick.

Additional alternating layers of chromium nitride and (Ti, Al,Cr)N can be deposited, if desired. Each layer of (Ti,Al, Cr)N and chromium nitride is typically in the range of from 0.1 to about 2.0 microns. Thinner layers are desirable because the mechanical and corrosion resistance of the multilayer coating is improved.

The (Ti,Al,Cr)N layer has high corrosion resistance and passes the 96 hr ASTM B 368-97 test, a copper accelerated acetic acid-salt spray test, which is a severe test for corrosion resistance.

Cookware having a multilayer (Ti,Al,Cr)N coating is suitable for cooking both acidic and salty-based foods without discoloration. In addition, the cookware can be used at any high cooking temperatures without worrying about damaging the cookware.

The (Ti,Al,Cr)N coating is much harder than (Ti,Al)N and CrN, resulting in high abrasion resistance. The (Ti,Al,Cr)N layer combines extreme hardness and high corrosion resistance, making the cooking surface of the cookware scratch resistant, stick resistant, and durable. It eliminates the problem of ions leaching from the base material of the cookware. The (Ti,Al,Cr)N layer is generally the top layer of the multilayer coating.

Although this example uses (Ti,Al,Cr)N and chromium nitride layers, it should be understood that the invention is not limited to those layers. Other layers can be used, as discussed above.

One or more layers of the ceramic coating are deposited using a physical vapor deposition process, such as evaporation, sputtering, cathodic arc, or ion beam. U.S. Pat. Nos. 6,906,295 and 7,462,375, which are incorporated herein by reference, describe a cathodic arc deposition process.

Figure 4:
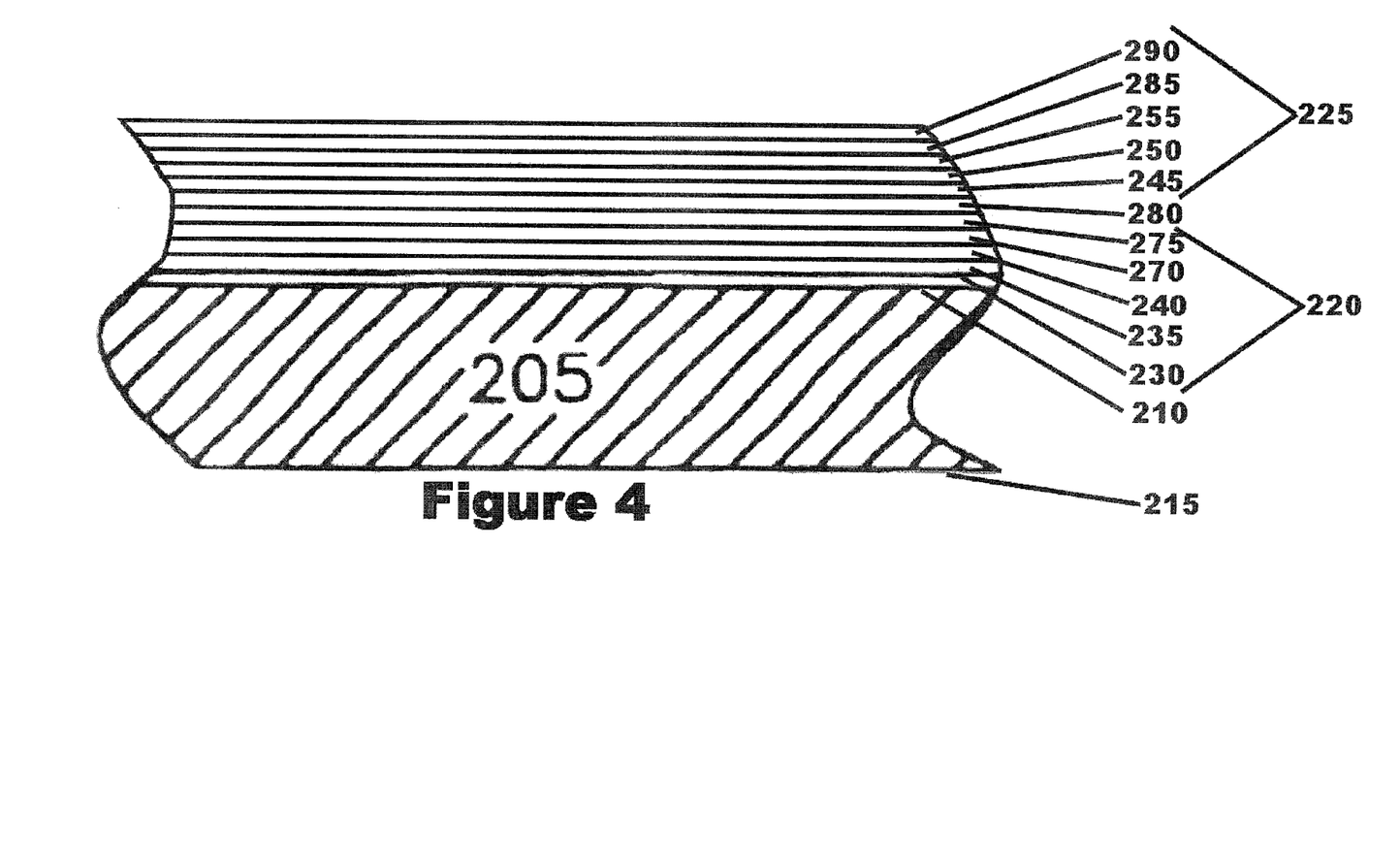
FIG. 4 is a cross-section of another embodiment of the article of the present invention.

FIG. 4 shows a cross-section of another embodiment of a metal article of the present invention. There is a metal substrate 205 having a first surface 210 and a second surface 215. A base coating 220 is deposited on the first surface 210 and a ceramic coating 225 deposited adjacent to the base coating 220.

The base coating 220 has a combination cathodic arc and sputtered bonding layer 230, a sputtered layer 235, and a second combination cathodic arc and sputtered bonding layer 240. There are also an additional sputtered layer 270 and a combination layer 275.

There is an additional layer 280 between the base coating 220 and the ceramic coating 225. Layer 280 can be a metal layer such as a Cr layer, deposited by a cathodic arc process.

There is a first layer of (Ti,Al,Cr)N 245 deposited on the additional layer 280, and a first layer of chromium nitride 250, and a second layer of (Ti,Al,Cr)N 255. There are additional layers of chromium nitride 285 and (Ti,Al,Cr)N 290.

Figure 5:
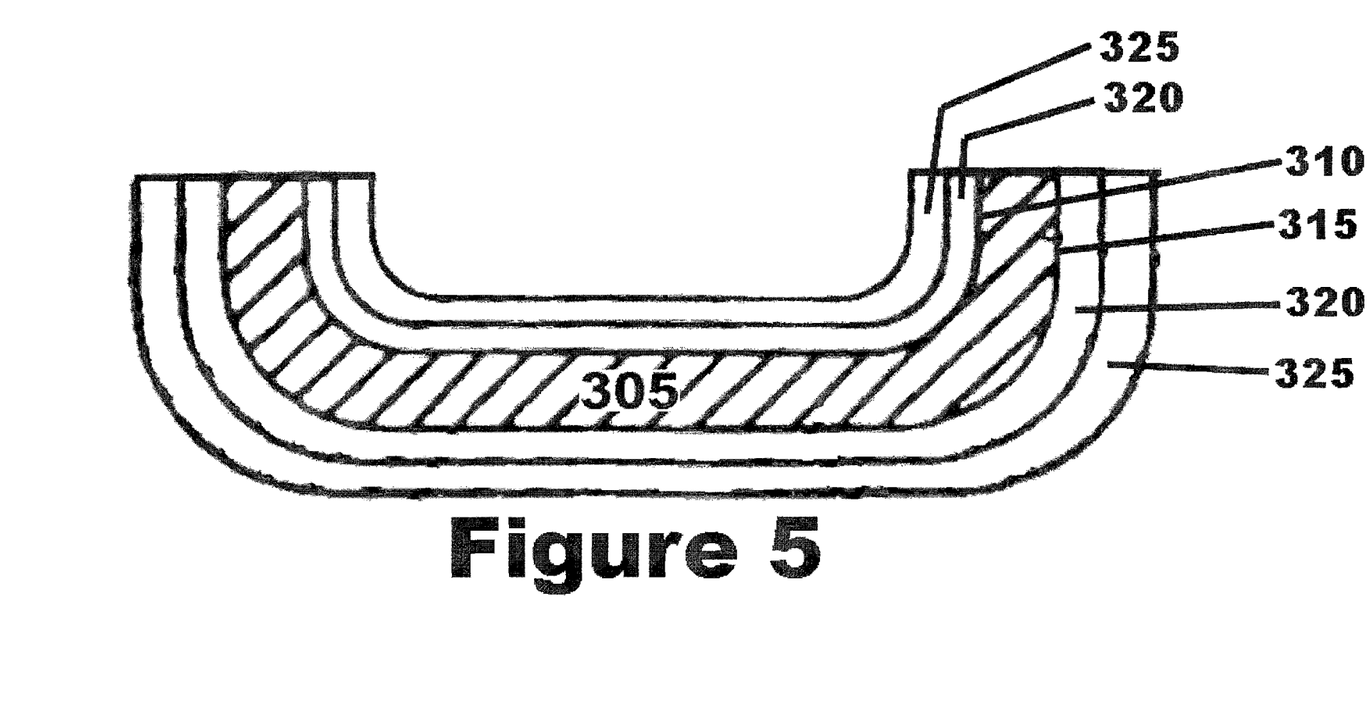
FIG. 5 is a cross-section of another embodiment of a pan made according to the present invention.

FIG. 5 shows a cross-section of another embodiment of a pan of the present invention. There is a metal substrate 305 having a first surface 310 and a second surface 315. Base coatings 320 and ceramic coatings 325 are deposited on both sides 310 and 315 of the substrate 305.

As an example, one process for depositing a coating on a foodware article will be described. Other processes or steps can be used, as is well-known to those of skill in the art.

The foodware article can be formed first and then coated, or a flat metal sheet can be coated and then formed into the pan. The process will be described for coating a preformed pan.

The plain copper pan can be polished before deposition to create a smooth surface. Buffing or grinding compound or another polishing medium, as is known to those in the art, can be used. The surface should be as smooth as possible, generally less than about 20 micro inches measured perpendicular to the concentric ground line on the surface, or less than about 16 micro inches, and typically in the range of about 10 to about 16 micron inches, although it is not necessary to achieve an ultra-bright surface finish, such as about 2 to about 4 micron inches.

The plain copper pans are then thoroughly cleaned and dried to remove any grease, polish residual, loose and embedded particles, oxides salt residual, or other foreign material. A typical cleaning would involve an aqueous cleaning system in conjunction with ultrasonic cleaning.

The processes of cathodic arc deposition and sputtering deposition can be operated separately or can be operated together at the same time in the same vacuum chamber, depending on the layer being deposited. Both the cathodic arc cathodes and sputtering cathodes can have their own desired targets with metal or alloy. This coating chamber can carry out the method in accordance with the invention, including the vacuum pumping system, gas-supplying system, parts holder, planetary rotation system, power sources and various electrical systems, which are required to perform the desired steps.

Figure 6:
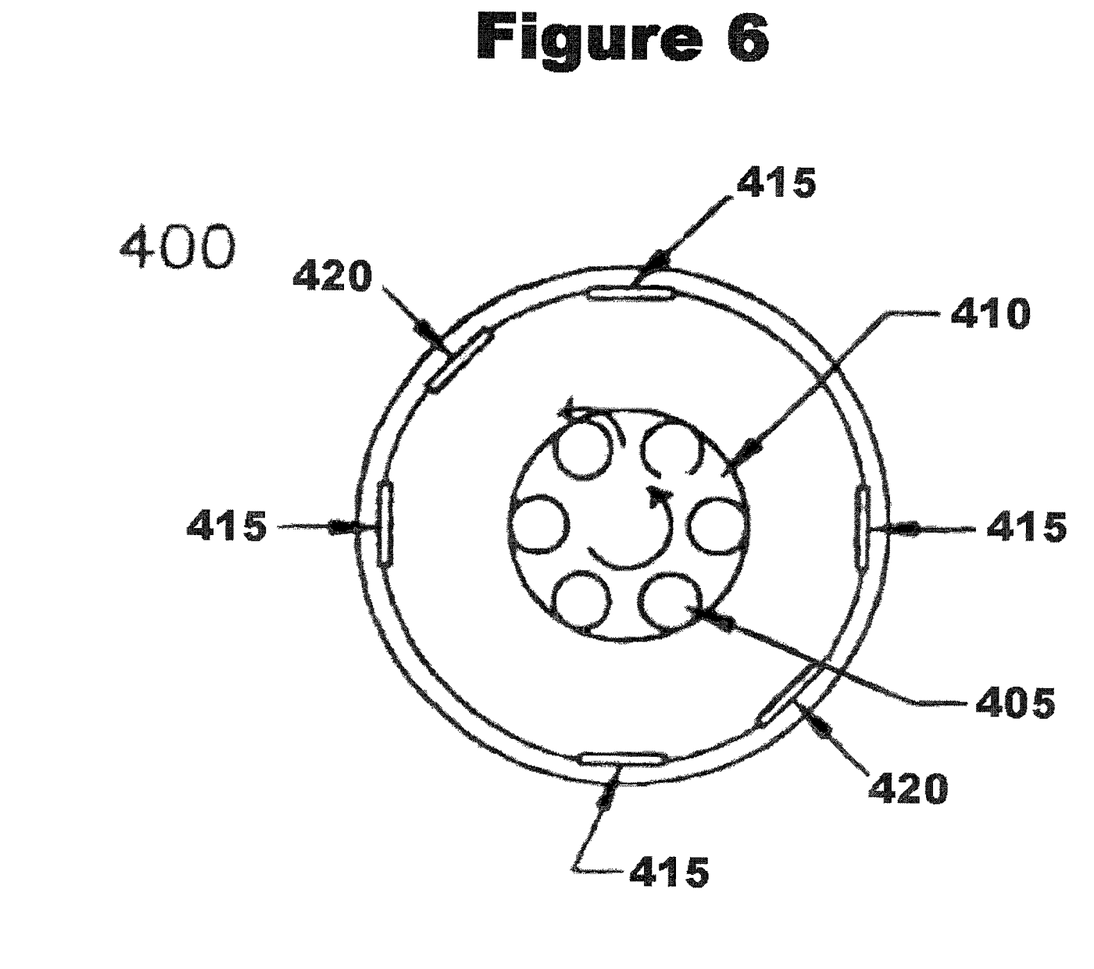
FIG. 6 is a schematic diagram of a deposition chamber useful in the present invention.

FIG. 6 is a diagram of an example of a deposition chamber 400 which can be used in the practice of one embodiment of the present invention. It is a multi-cathode system, including a cathodic arc system and a sputtering system. Appropriate cathodic arc cathodes 415 are placed in the chamber as shown in FIG. 6. For example, compressed powder metal target of 50% titanuim/50% aluminum (at) can be used, along with compressed powder metal targets of pure chromium. Appropriate rectangular sputtering cathodes 420 are placed in the same chamber. For example, stainless steel target or titanium target can be used. The number and the type of cathodic arc cathodes and sputtering cathodes, as well as the material of the targets used, will depend on the size of the chamber and the coating being deposited.

The pans 405, for example plain copper pans, are loaded into a suitable fixture, and placed in the planetary 410 with the desired rotation. All pans can be rotated during deposition as shown. The individual pans 405 can also be rotated, if desired.

The chamber is pumped down to a pressure of about $10^{-3}$ Pa. The pans are heated to a temperature in the range of about 350° F. to about 450° F., depending on the type of material the pan is made of.

A glow discharge is created by biasing the pan with a negative voltage of about 800 to about 1200V to micro-clean the pan.

The combination bonding layer of the base coating is a mixed layer deposited by the sputtering process and the cathodic arc process operated at the same time. The sputtering of the targets, for example, titanium, chromium, or stainless steel, is accomplished by bombardment with high-energy ions of the rare gas argon at a bias voltage of the substrate of about 200 to about 500V and a vacuum level controlled at about 0.3 to about 1.0 Pa. The emitted atoms from the sputtering targets are deposited on the substrate, forming a smooth, dense film. The sputtering parameters can be precisely controlled based on a variable sputtering system, as is well known in the art.

At the same time, targets for the cathodic arc process, for example chromium, or titanium, are stroked by a high current, low voltage arc in same argon atmosphere and vacuum level, resulting in a plasma jet containing high level of ionization multiply charged ions, neutral particles, clusters and macro-particles. The high energetic ions (Cr+, Ti+) can penetrate into the substrate to a depth that provides good strength of adhesion to the substrate. The deposits from the sputtering and cathodic arc processes become superimposed in the combination bonding layer. In general, the combination bonding layer contains more condensed atoms from the sputtering process than condensed ions from the cathodic arc process, producing a smooth, dense combination layer with good adhesion to the substrate. The amount of deposit from the cathodic arc process should be sufficient to provide the desired adhesion strength while limiting the negative effect of the macro-particles on the smooth bonding layer. Desirably, the deposit from the cathodic arc process is up to about 40% of the entire deposit for the combination layer. The thickness of the combination layer is generally in the range of about 0.1 to about 3.0 micron.

One layer of the base coating deposited adjacent to the combination layer is a sputtered layer. It can be made by turning off all of the targets for the cathodic arc process. The sputtering can be carried on continuously using the same operating parameters as for the combination layer, if desired. The thickness of the first sputtered layer is typically between about 0.1 and about 3 microns.

Another layer of the base coating is another combination layer deposited adjacent to the first layer. The combination layer is made using a sputtering process and a cathodic arc process as discussed above. The thickness of the second combination layer of base coating is generally about 0.1 to about 3 microns.

Adjacent to the base coating, a functional ceramic coating, for example, (Ti, Al, Cr)N, is deposited by a cathodic arc process.

A metal layer, for example Cr, can be deposited adjacent to the base coating when all the sputtering targets are turned off. The pan is bombarded with ions (Cr+) at a bias voltage of about 600 to about 1000V at a vacuum level of about $10^{-2}$ Pa. The metal layer can have a thickness of less than about 1 micron.

Turning on all of the TiAl and Cr targets, nitrogen is then introduced into the system to form the (Ti, Al, Cr)N coating. The applied voltage is about 80 to about 200V at a vacuum level of about 0.4 to about 1.5 Pa.

The TiAl cathodes are turned off, while the Cr cathodes remain on to deposit a layer of chromium nitride at a bias voltage of about 80 to about 200V and a vacuum level of about 0.4 to about 1.5 Pa.

The TiAl cathodes are then turned back on to deposit another layer of (Ti, Al, Cr)N. This procedure can be repeated to deposit as many layers of chromium nitride and (Ti, Al, Cr)N as desired. The deposition temperature can be raised up to about 600° F. to about 900° F. at the end of deposition, depending on the material the pan is made of.

The pan can be given a final polish using Jeweler Rouge, diamond compound or another polishing medium, as is known to those skilled in the art, to achieve a surface that is free of embedded particulate and coating residuals.

The composition of the various (Ti, Al, Cr)N layers can be the same, or it can be different for different layers, if desired. The composition can be varied by altering the number and type of targets being used for each layer, as is well-known in the art.

In a cathodic arc deposition process, the number of Cr targets is desirably greater than or equal to the number of TiAl targets used in depositing the (Ti, Al, Cr)N layer, so as to balance all of the combined physical properties (i.e., stick resistance, oxidation resistance, toughness, color stability, etc.) of the coating. When the number of TiAl is greater than the number of Cr targets, the (Ti, Al, Cr)N coating shows slight discoloration in cooking salty-based foods, although the resultant (Ti, Al, Cr)N coating is still well suited for use as a stick resistant coating. Although the discoloration may not be desirable for cosmetic reasons for some uses, it may not be a problem for other uses. It can be easily removed using Bar Keepers™ cleaner or a few drops of lemon juice.

For example, the copper pan shown in FIG. 5 can be constructed from a plain copper material with a total thickness of 1.4 mm coated with the coating of this invention at the thickness under 30 microns (on one side). With such thin coating (0.003 mm) compared to the total thickness of 1.4 mm of copper material, the effects of the coating on the thermal conductivity of the pan can be neglected. Therefore, PCP (Plain Copper PVD) cookware has the same thermal conductivity as pure copper, which is a unique feature.

Table 1 compares the hardness of the coating of present invention with the interior layer of 304 stainless steel in 3-ply and 5-ply clad stainless steel cookware. The hardness of the coating of the present invention is approximately 5-7 times harder than the interior layer of 304 stainless steel. Consequently, the durability of the cooking surface of PCP cookware is about 5-7 times better than the cooking surface of 3-ply or 5-ply clad stainless steel, which is another unique feature of PCP cookware.

In addition, PCP cookware exhibits excellent thermal stability. PCP cookware can withstand temperatures up to about 700° C. as a result of the functional multilayer coating of (Ti,Al,Cr)N. In normal cooking, the cooking temperature is typically under about 300° C. A comparison between a PCP copper pan and a 5-ply clad stainless pan was conducted by heating both pans at 350° C. for 15 minutes. The PCP pan showed no color change, maintaining the original shiny surface over the entire surface. The 5-Ply clad pan showed discoloration or scorching (brown color), over the entire surface, which is an indication that stainless steel is not heat resistant during cooking at high temperatures.

Another unique feature of PCP cookware is its good corrosion resistance; it is tarnish-free. It is well known that copper material tarnishes easily. The plain copper cookware coated with the coating of present invention is tarnish-free.

EXAMPLE 1

10 inch pans made from plain copper having a thickness of 1.4 mm were coated with the coating of the present invention on entire surface of cookware. The multilayer ceramic coating included a base coating that was about 3-5 microns. The base coating was a combination cathodic arc and sputtered layer made from Cr, Ti, and stainless steel (0.2-0.4 microns), a sputtered layer of Ti and stainless steel (0.3-0.5 microns), followed by 4 pairs of alternating combination cathodic arc and sputtered layers, and sputtered layers, made from the same compositions as the previous layers. The top layer of the base coating was a combination cathodic arc and sputtered layer. The ceramic coating was about 5-6 microns, and included 6 pairs of alternating superlattice (Ti,Al,Cr)N and CrN, followed by (Ti,Al,Cr)N as the top coating. The total coating thickness, including the base coating and the ceramic coating was about 10-12 microns (one side). The same multilayer ceramic coating was on the outside of the pan.

The PCP pans were tested and compared to 5-ply stainless steel cookware (5-ply clad), and clad copper cookware (Cu clad).

Table 2 provides the results of the comparison of 10 in. PCP pans with 10 in. 5-ply clad pans. The same food was cooked in each pan. The pans were evaluated for preheat time, cooking time, whether the food stuck to the pan, and ease of cleaning.

Sample 1—Strip Steak.

The PCP pan had a shorter preheating time, and the total cooking time is almost 2 minutes shorter than the 5-ply clad pan, even at a lower heat setting. In addition, the steak did not stick to the PCP pan.

Sample 2—Pasta Primavera

The PCP pan heated faster, and cooked faster than the 5-ply pan, even at low heat setting. There was no discoloration or scorching during cooking for the PCP pan. The cooking surface of the 5-ply clad pan scorched badly. The scorched surface was difficult to clean using a normal consumer cleaning method. Cleaning with an industrial scotch pad showed scratches all over, and 304 layer of material can be removed if scrubbing is forced. Scrubbing the cooking surface of the PCP pan using the industrial scotch pad did not cause scratching.

Sample 3—Lake Trout

The PCP pan cooked faster than the 5-ply clad pan. The trout browned better in the PCP pan, and it was easy to clean. The 5-ply clad pan needed some scrubbing to clean.

Sample 4—Filet Mignon

The meat was seared in the pan, then the pan was placed in the oven at 350° F. for 10 minutes. It took 35 seconds for the PCP pan to sear the filet mignon to obtain the desired browning, while it took one minute in the 5-ply clad for same browning. Then both pans were put into the oven. The filet mignon cooked in the PCP pan had more juices because the PCP pan sears quicker, trapping in juices and moisture, and the meat tastes better. The filet mignon cooked in the 5-ply clad pan was slightly dry. The 5-ply clad pan was scorched during cooking and required scrubbing the surface, causing many scratches.

Sample 5—Balsamic Syrup

Balsamic vinegar was boiled until it turned into syrup that is very sticky. This experiment was used to study the cleanability of the pan for removing syrup. It only took 10 seconds to remove all syrup from the PCP pan simply by rinsing with hot water. However, the 5-ply clad pan needed scrubbing to remove the syrup.

Sample 6—Stir Frying Chicken Coated With Starch

This experiment was designed to study the non-stick ability. Meat with starch sticks easily to the pan. The PCP pan and the 5-ply pan were coated with the same amount oil, the pan was heated, and then the chicken was dropped into the pan when the oil began to steam.

The chicken stir-fried in the PCP pan did not stick because the PCP pan was very hot due to the excellent heat conductivity of the pan. The PCP pan seared the meat quickly so that the meat did not stick. Although the same heat setting was used, the 5-ply clad pan was not as hot as the PCP pan due to its inferior heat conductivity, and the meat stuck badly. The 5-ply clad pan was scorched all over, and was difficult to clean. The pan needed to be soaked in hot water for hours before scrubbing the surface.

Sample 7—Fry Egg

Both pans were sprayed with same amount cooking oil. The pans were heated, and most of the oil was wiped off with a paper towel. The egg was dropped when the oil began steaming. The egg fried in the PCP pan did not stick. The egg fried in the 5-ply clad pan stuck.

EXAMPLE 2

Table 3 shows the comparison of 10 in. PCP pans with 10 in. clad copper pans. Clad copper cookware is known to have the best heat conductivity in existing cookware. The same food was cooked in both pans. The pans were evaluated for preheat time, cooking time, whether the food stuck to the pan, and ease of cleaning.

Sample 8—Frying Chicken

The PCP pan heated up faster, and the chicken had better browning color. Also, the cleaning of the PCP pan was faster at 35 seconds, compared with the clad copper pan at 2 minutes.

Sample 9—Frying Shrimp

The PCP pan heated up faster, and the shrimp had better browning color. The cooking surface of the clad copper pan was scorched during the cooking, while the PCP pan showed no discoloration. Scrubbing the scorched surface caused scratches.

Sample 10—Stir Frying Beef With Soy Sauce

The PCP pan heated up faster, and the meat had better browning color.

Examples 1 and 2 demonstrate the unique features of PCP cookware. The PCP pan has excellent heat conductivity, resulting in good cooking performance, as compared to the 5-ply clad stainless steel pan or the clad copper pan, which have lower heat conductivity. The unique features come from the multilayer coating that enables the use of soft, plain copper as the base material for cookware.

The PCP cookware has high heat conductivity due to the use of copper. As a result, the pan heats incredibly quickly and evenly, also cools very rapidly. In addition, lower heat settings can be used while still maintaining excellent cooking.

The multilayer coating is 5-7 times harder than that of 304 stainless steel. Therefore, PCP copper cookware is much more durable than 3-ply and 5-ply clad stainless cookware and copper clad cookware. The coating provides excellent scratch resistance, allowing the use of abrasive scotch grit without scratching. The cookware is safe for metal utensils, easy to clean, and has a long life.

The cookware has excellent corrosion resistance and is tarnish-free. It can withstand high temperatures up to about 700° C. It is safe to use with salty or acidic-based food. It is dishwasher safe.

Combining the advantages of plain copper and the multilayer coating, PCP cookware has heat conductivity which is the same as pure copper, good corrosion resistance, high durability, excellent cooking properties, and easy cleaning. A long lasting, new plain copper cookware without tarnish becomes reality from this invention.

While certain representative embodiments and details have been shown for purposes of illustrating the invention, it will be apparent to those skilled in the art that various changes in the compositions and methods disclosed herein may be made without departing from the scope of the invention, which is defined in the appended claims.

TABLE 1

Hardness Clad Stainless Cookware (5 Ply and 3 Ply)

| Sample | Type of Cookware | Hardness of Interior 304 Layer |
|---|---|---|
| 1 | 5 Ply, Cu core (10" Pan) | HRC 28 |
| 2 | 5 Ply, Cu core (8" Pan) | HRC 23 |
| 3 | 5 Ply, Al Core (10" Pan) | HRB 99/HRC 21 |
| 4 | 3 Ply (10" pan) | HRB 91 |
| 5 | 3 Ply (another 10" Pan) | HRB 92 |

Micro-Hardness of the coating of present invention: 2305-2450 KHN25

TABLE 2

Comparison of PCP Plain Copper Cookware with 5-Ply Clad Stainless Steel Cookware

| Item | Type of Pan | Food Cooked | stick Y/N | Preheating Pan (min) | Heat Setting | Cooking time (min) | Remarks |
|---|---|---|---|---|---|---|---|
| 1 | PCP Pan | Strip Steak | N | 40 seconds | med-high | 2:20 | cooked faster. Non-stick Sears very quickly and great color |
|  | 5-Ply clad Pan | same as above | Y | 1:20 | high | 4:12 | Took longer to brown |
| 2 | PCP Pan | Pasta Primavera | N | 35 seconds | med-low | 8:00 | preheating faster than 5-Ply clad. No scorching. Ease of cleaning |
|  | 5-Ply clad Pan | same as above | N | 1:00 | med-high | 9:00 | Pan is scorched badly. Scrabbling pan caused scratches all over interior surface. |
| 3 | PCP Pan | Lake Trout | N | 45 seconds | med | 3:40 | Cooked faster than 5-Ply clad. Better browning. Easy to clean |
|  | 5-Ply clad Pan | same as above | N | 1:20 | med-high | 4:00 | Some scrubbing required to clean |
| 4 | PCP Pan | filet mignon | N | 35 seconds | med | 2:50 | Oven 350 F., 10 mins. Pan sears meat quickly, trapping in juices & moisture |
|  | 5-Ply clad Pan | same as above | Y | 1:00 | high | 2:50 | Oven 350 F., 10 mins. Pan was scorched. Scubbing surface for cleaning |
| 5 | PCP Pan | Balsamic Vinegar | NA |  | high |  | Clean Syrup with rinse water for only 10 seconds |
|  | 5-Ply clad Pan | same as above | NA |  | high |  | Cleaning Syrup require much scrubbing |
| 6 | PCP Pan | Frying Chicken | N | 30 seconds | med-high | 1:42 | Cooks very quick. Non-Stick |
|  | 5-Ply clad Pan | same as above | Y | 45 seconds | med-high | 2:17 | Stuck badly. Pan was scorched all over the cooking surface.hardly to be cleaned |
| 7 | PCP Pan | Fry egg | N | 1"00 | med | 3:00 | No-stick |
|  | 5-Ply clad Pan | same as above | Y | 1:00 | med | 3:00 | Stuck |

TABLE 3

Comparison of PCP Plain Copper Cookware with Clad Copper Cookware

| Item | Type of Pan | Food Cooked | stick Y/N | Preheating Pan (min) | Heat Setting | Cooking time (min) | Results |
|---|---|---|---|---|---|---|---|
| 8 | PCP Pan | Fry Chicken | N | 1:30 | high | 4:00 | Heats up faster than clad copper pan Better color. Cleaning took 35 seconds |
|  | Clad Copper Pan | same as above | N | 2:00 | high | 4:35 | Cleaning took 2 minutes due to some scorched sports |
| 9 | PCP Pan | Fry shrimp | N | 1:30 | med. | 2:52 | Results same as #8. No discoloration |
|  | Clad Copper Pan | same as above | N | 1:53 | med. | 3:17 | quite scorched surface. Scrubbing caused many scrteches. |
| 10 | PCP Pan | Stir frying beef | N | 1:00 | high | 3:58 | meat has better browning color that clad copper pan |
|  | Clad Copper Pan | same as above | N | 1:30 | high | 3:58 |  |

What is claimed is:

1. A copper foodware article having a multilayer, stick-resistant, tarnish-free coating comprising:
a plain copper substrate;
a base coating deposited on a first surface of the copper substrate, the base coating comprising a first combination cathodic arc and sputtered bonding layer and a first sputtered layer, the first combination cathodic arc and sputtered bonding layer comprising metals, or alloys of metals, and the first sputtered layer comprising metals, or alloys of metals; and
a ceramic coating deposited adjacent to the base coating on a side opposite the plain copper substrate, the ceramic coating comprising a PVD nitride or carbonitride layer.

2. The copper foodware article of claim 1 further comprising at least one additional layer deposited between the first combination cathodic arc and sputtered bonding layer and the ceramic coating, the additional layer selected from a sputtered layer, a cathodic arc layer, or a combination cathodic arc and sputtered layer, the additional layer comprising metals, or alloys of metals.

3. The copper foodware article of claim 1 wherein the first combination cathodic arc and sputtered bonding layer is made of a material selected from titanium, chromium, zirconium, niobium, hafnium, stainless steel, and alloys thereof.

4. The copper foodware article of claim 1 wherein the PVD nitride or carbonitride layer is selected from nitrides or carbonitrides of at least one element from Groups 4, 5, or 6, or Al, or B.

5. The copper foodware article of claim 1 wherein the PVD nitride or carbonitride layer comprises (Al,Cr)N, (Al, Cr)CN, (Al, Cr,X)N, or (Al,Cr,X)CN, where X is Ti, Zr, Nb, V, Mo, or B.

6. The copper foodware article of claim 1 wherein the PVD nitride or carbonitride layer is biocompatible.

7. The copper foodware article of claim 1 wherein the PVD nitride or carbonitride layer comprises (Ti, Al, Cr)N or (Ti, Al, Cr)CN.

8. The copper foodware article of claim 1 further comprising at least one outer layer deposited adjacent to the PVD nitride or carbonitride layer on a side opposite the base coating, the at least one outer layer selected from alternating layers of CrN and (Ti,Al)N, or CrCN and (Ti,Al)CN, or (Ti,Al,Cr)N and CrN, or (Ti,Al,Cr)CN and CrCN.

9. The copper foodware article of claim 1 wherein the PVD nitride or carbonitride is deposited by a physical vapor deposition process selected from sputtering, reactive sputtering, magnetron sputtering, and a cathodic arc process.

10. The copper foodware article of claim 1 wherein a thickness of the base coating is in a range from about 0.2 to about 20 microns, and a thickness of the ceramic coating is in a range of about 1.0 to about 20 microns.

11. The copper foodware article of claim 1 wherein a surface of the substrate has a surface finish of less than about 20 micro-inches before depositing the base coating.

12. The copper foodware article of claim 1 wherein in the first combination cathodic arc and sputtered bonding layer, an amount of metal or metal alloy deposited from one or more cathodic arc targets is in a range of about 5% to about 40% of a total amount of metal or metal alloy deposited from both the one or more cathodic arc targets and one or more sputtering targets.

13. The copper foodware article of claim 1 wherein the base coating further comprises alternating second combination cathodic arc and sputtered layers and second sputtered layers.

14. A metal foodware article having a multilayer, stick resistant, tarnish-free ceramic coating comprising:
a metal substrate;
a base coating deposited on a first surface of the metal substrate comprising a first combination cathodic arc and sputtered bonding layer and a first sputtered layer, the first combination cathodic arc and sputtered bonding layer comprising metals, or alloys of metals, and the first sputtered layer comprising metals, or alloys of metals; and
a ceramic coating deposited adjacent to the base coating on a side opposite the metal substrate, the ceramic coating comprising a biocompatible PVD nitride or carbonitride layer.

15. The metal foodware article of claim 14 wherein the metal substrate is made of a material selected from aluminum, steel, cast iron, clad copper, and alloys thereof.

16. The metal foodware article of claim 14 further comprising at least one additional layer deposited between the first combination cathodic arc and sputtered bonding layer and the ceramic coating, the additional layer selected from a sputtered layer, a cathodic arc layer, or a combination cathodic arc and sputtered layer, the additional layer comprising metals, or alloys of metals.

17. The metal foodware article of claim 14 wherein the first combination cathodic arc and sputtered bonding layer comprises titanium, chromium, zirconium, niobium, hafnium, stainless steel, or alloys thereof.

18. The metal foodware article of claim 14 wherein the PVD nitride or carbonitride layer is selected from nitrides or carbonitrides of at least one element from Groups 4, 5, or 6, or Al, or B.

19. The metal foodware article of claim 14 wherein the PVD nitride or carbonitride layer comprises (Al,Cr)N, (Al, Cr)CN, (Al, Cr, X)N or (Al, Cr, X)CN, where X is selected from Ti, Zr, Nb, V, Mo, and B.

20. The metal foodware article of claim 14 further comprising at least one outer layer deposited adjacent to the PVD nitride or carbonitride layer on a side opposite the base coating, the at least one outer layer selected from alternating layers of CrN and (Ti,Al)N, or CrCN and (Ti,Al)CN, or (Ti,Al,Cr)N and CrN, or (Ti,Al,Cr)CN and CrCN.

21. The metal foodware article of claim 14 wherein a thickness of the base coating is in a range from about 0.2 to about 20 microns, and a thickness of the ceramic coating is in a range of about 1.0 to about 20 microns.

22. The metal foodware article of claim 14 wherein a surface of the substrate has a surface finish of less than about 20 micron-inches before depositing the base coating.

23. The metal foodware article of claim 14 wherein in the first combination cathodic arc and sputtered bonding layer, an amount of metal or metal alloy deposited from one or more cathodic arc targets is in a range of about 5% to about 40% of a total amount of metal or metal alloy deposited from both the one or more cathodic arc targets and one or more sputtering targets.

24. The metal foodware article of claim 14 wherein the base coating further comprises alternating second combination cathodic arc and sputtered layers and second sputtered layers.

25. A method of making a metal foodware article having a multilayer, stick resistant, tarnish-free coating, the method comprising:

provinding a metal substrate;

depositing a base coating on a first surface of the metal substrate comprising depositing a first combination cathodic arc and sputtered bonding layer using a combination of a cathodic arc process and a sputtering process, and depositing a first sputtered layer using a sputtering process, wherein the first combination cathodic arc and sputtered bonding layer is made of metals, or alloys of metals, and the first sputtered layer is made of metals, or alloys; and depositing a ceramic coating adjacent to the base coating on a side opposite the metal substrate comprising depositing a nitride or carbonitride layer using PVD process.

26. The metal foodware article of claim 25 wherein the metal substrate is a clad material comprising stainless steel-clad aluminum, stainless steel-clad copper, aluminum having a plasma sprayed stainless steel coating, or metal outer layers surrounding non-metallic core materials.

* * * * *

UNITED STATES PATENT AND TRADEMARK OFFICE
CERTIFICATE OF CORRECTION

| | |
|---|---|
| PATENT NO. | : 8,021,768 B2 |
| APPLICATION NO. | : 12/419552 |
| DATED | : September 20, 2011 |
| INVENTOR(S) | : Ge |

It is certified that error appears in the above-identified patent and that said Letters Patent is hereby corrected as shown below:

<u>On the Title page (Item 54) at Col. 1, lines 1-4</u>:

Delete the title and replace it with the following:

--PLAIN COPPER FOODWARE AND METAL ARTICLES WITH DURABLE AND TARNISH FREE MULTILAYER CERAMIC COATING AND METHOD OF MAKING--.

Signed and Sealed this
Eighteenth Day of September, 2012

David J. Kappos
*Director of the United States Patent and Trademark Office*